US010749476B2

(12) United States Patent
Sutskover et al.

(10) Patent No.: US 10,749,476 B2
(45) Date of Patent: Aug. 18, 2020

(54) CONTROL OF ENVELOPE TRACKER PMIC

(71) Applicant: Intel IP Corporation, Santa Clara, CA (US)

(72) Inventors: Ilan Sutskover, Hadera (IL); Eran Segev, Tel Aviv (IL); Stephan Henzler, Munich (DE); Alexander Belitzer, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/387,986

(22) Filed: Apr. 18, 2019

(65) Prior Publication Data

US 2019/0245489 A1  Aug. 8, 2019

Related U.S. Application Data

(63) Continuation of application No. 15/866,951, filed on Jan. 10, 2018, now Pat. No. 10,291,184.

(51) Int. Cl.
*H03G 3/20* (2006.01)
*H03F 1/02* (2006.01)
(Continued)

(52) U.S. Cl.
CPC ......... *H03F 1/0222* (2013.01); *H03F 1/025* (2013.01); *H03F 1/34* (2013.01); *H03F 3/195* (2013.01);
(Continued)

(58) Field of Classification Search
CPC ....................................................... H03G 3/20
(Continued)

(56) References Cited

U.S. PATENT DOCUMENTS 7,859,336 B2 * 12/2010 Markowski ........... H03F 1/0227
330/136
8,874,052 B2 * 10/2014 Goedken ............... H04W 72/04
455/127.1
(Continued)

OTHER PUBLICATIONS

"Envelope Tracking for Cellular RF Power Amplifiers." PowerGuru- Power Electronics Information Portal. Mar. 31, 2014. 5 pages.
(Continued)

*Primary Examiner* — Henry Choe
(74) *Attorney, Agent, or Firm* — 2SPL Patent Attorneys PartG mbB

(57) ABSTRACT

A tracker circuit configured to provide a variable supply voltage to a power amplifier (PA) circuit is disclosed. The tracker circuit includes a state machine circuit comprising a plurality of states mapped in accordance with transitions associated with a mapping scheme. In some embodiments, the plurality of states of the state machine circuit identify one or more operational modes associated with the tracker circuit, wherein at least one operational mode comprises one or more voltage levels respectively associated therewith. In some embodiments, the one or more operational modes includes at least two active operational modes. In some embodiments, a transition between the one or more operational modes of the tracker circuit is controlled by a digital selection signal received from a digital communication interface associated therewith.

20 Claims, 6 Drawing Sheets

(51) Int. Cl.
*H03F 1/34* (2006.01)
*H03F 3/24* (2006.01)
*H04W 76/27* (2018.01)
*H03F 3/195* (2006.01)
*H03F 3/189* (2006.01)
*H03K 23/00* (2006.01)

(52) U.S. Cl.
CPC .............. *H03F 3/24* (2013.01); *H03F 3/245* (2013.01); *H04W 76/27* (2018.02); *H03F 3/189* (2013.01); *H03F 2200/102* (2013.01); *H03F 2200/504* (2013.01); *H03F 2200/507* (2013.01); *H03F 2200/511* (2013.01); *H03F 2200/546* (2013.01); *H03K 23/005* (2013.01)

(58) Field of Classification Search
USPC .................................................. 330/129, 136
See application file for complete search history.

(56) References Cited

U.S. PATENT DOCUMENTS

| | | | |
|---|---|---|---|
| 9,374,786 | B1 | 6/2016 | Maheshwari et al. |
| 9,385,666 | B2* | 7/2016 | Tam ...................... H03F 1/3247 |
| 9,479,118 | B2 | 10/2016 | Khlat et al. |
| 9,516,693 | B2 | 12/2016 | Khlat et al. |
| 9,595,981 | B2 | 3/2017 | Khlat |
| 9,794,006 | B2* | 10/2017 | Carlsson ............... H03F 1/0222 |
| 10,128,803 | B2* | 11/2018 | Das ........................ H03F 3/183 |
| 2009/0184764 | A1* | 7/2009 | Markowski ........... H03F 1/0227 |
| | | | 330/136 |
| 2014/0155127 | A1 | 6/2014 | Dakshinamurthy et al. |
| 2014/0181581 | A1* | 6/2014 | Flautner .............. G06F 11/1604 |
| | | | 714/15 |
| 2014/0266456 | A1 | 9/2014 | Vice et al. |
| 2015/0155834 | A1 | 6/2015 | Ripley et al. |
| 2015/0326327 | A1* | 11/2015 | Carlsson ............... H03F 1/0222 |
| | | | 375/224 |
| 2016/0087590 | A1 | 3/2016 | Menegoli et al. |
| 2016/0277045 | A1 | 9/2016 | Langer |
| 2017/0195972 | A1 | 7/2017 | Drogi et al. |

OTHER PUBLICATIONS

"Envelope Tracking Circuit Block Diagram." Envelope Tracking Circuit Block Diagram/Electronics Notes. 10 pages.
"What is RF Amplifier Envelope Tracking: A Primer." What is RF Envelope Tracking—A Primer/Electronic Notes.14 pages.
"RF Front End Interface (RFFE)." mipi alliance. Technology Brief. 3 pages.
Notice of Allowance dated Jan. 4, 2019 for U.S. Appl. No. 15/866,951.
International Search Report dated Mar. 13, 2019 for International Application PCT/US2018/064678.

* cited by examiner

CONTROL OF ENVELOPE TRACKER PMIC

REFERENCE TO RELATED APPLICATION

This application is a continuation of U.S. application Ser. No. 15/866,951 filed on Jan. 10, 2018, the contents of which are incorporated by reference in their entirety.

FIELD

The present disclosure relates to the field of envelope tracking, and in particular to a method and an apparatus for the control of envelope tracking systems.

BACKGROUND

Wireless communication systems typically use power amplifiers to amplify signals prior to over the air transmission. The efficiency of a power amplifier generally impacts the performance of devices such as mobile phones and base stations. Envelope tracking provides significant advantages in terms of minimizing power consumption in the power amplifiers and this can have a significant impact on thermal aspects of the devices and on battery life. Envelope tracking systems provide a variable voltage level to a power amplifier (PA) to ensure that the PA is operating at an optimum efficiency for a given instantaneous output power requirement. Envelope tracking systems typically comprise one or more operational modes and a transition between the different operational modes is essential for the efficient operation of the power amplifier.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
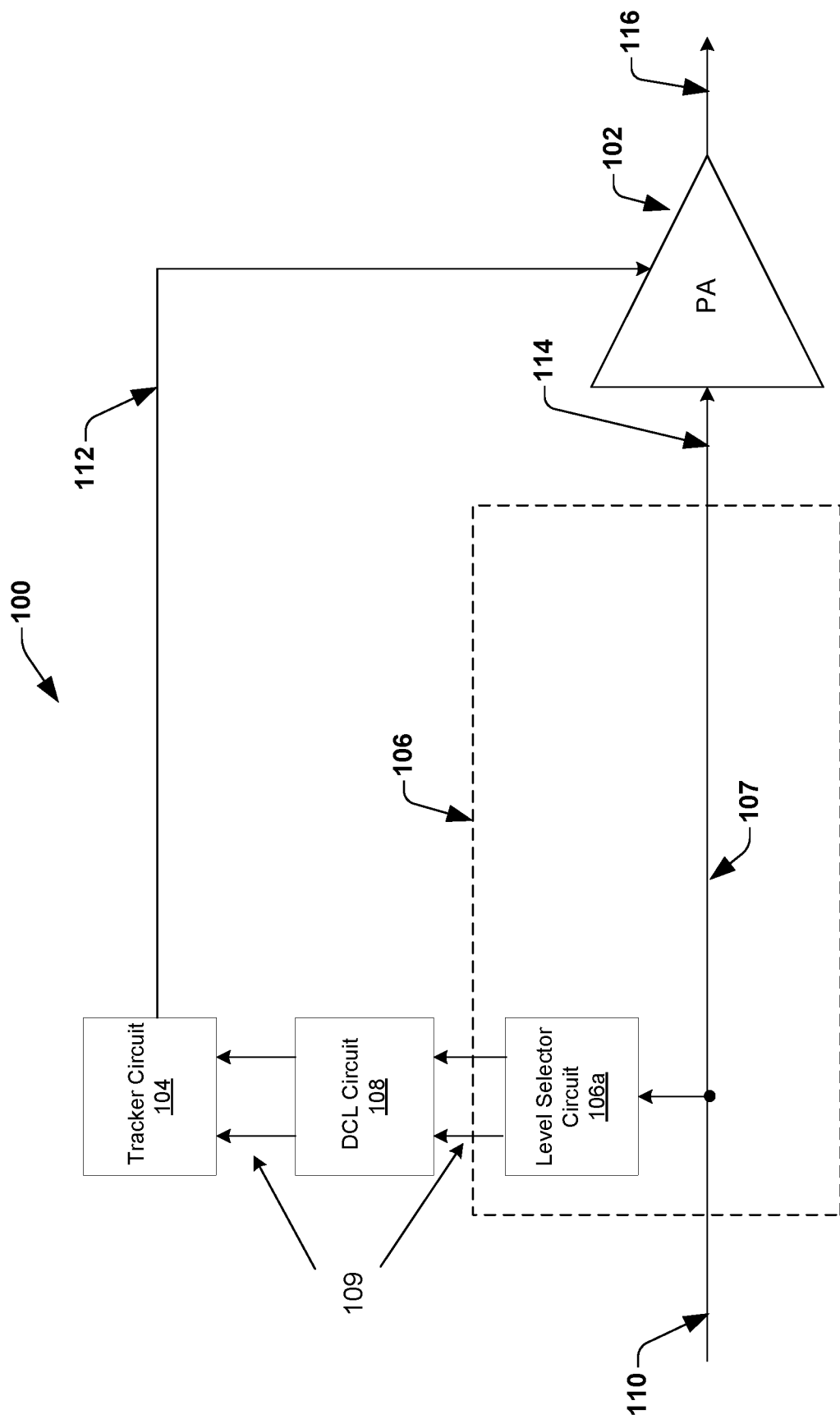
FIG. 1 illustrates an exemplary simplified block diagram of a power amplifier (PA) system, according to one embodiment of the disclosure.

In one embodiment of the disclosure, a tracker circuit configured to provide a variable supply voltage to a power amplifier (PA) circuit is disclosed. In some embodiments, the tracker circuit comprises a predefined state machine circuit comprising a plurality of states mapped in accordance with transitions associated with a predefined mapping scheme. In some embodiments, the plurality of states of the state machine circuit identify one or more operational modes associated with the tracker circuit. In some embodiments, the one or more operational modes comprises one or more voltage levels respectively associated therewith. In some embodiments, the one or more operational modes comprises at least two active operational modes. In some embodiments, a transition between the one or more operational modes of the tracker circuit is dictated by a decoding of a digital selection signal received from a digital communication interface associated therewith.

In one embodiment of the disclosure, an apparatus for envelope tracking associated with a power amplifier (PA) system is disclosed. The apparatus comprises a tracker circuit configured to provide a variable supply voltage to the PA circuit. In some embodiments, the apparatus comprises a tracker circuit comprising a predefined state machine circuit comprising a plurality of states mapped in accordance with transitions associated with a predefined mapping scheme. In some embodiments, the plurality of states of the state machine circuit identify one or more operational modes associated with the tracker circuit, wherein the one or more operational modes comprises one or more voltage levels respectively associated therewith. In some embodiments, the one or more operational modes comprise at least two different active operational modes. In some embodiments, a transition between the one or more operational modes of the tracker circuit is dictated by a decoding of a digital selection signal received from a digital communication interface associated therewith.

In one embodiment of the disclosure, a tracker circuit configured to provide a variable supply voltage to a power amplifier (PA) circuit is disclosed. The tracker circuit comprises a predefined state machine circuit comprising a plurality of states mapped in accordance with transitions associated with a predefined mapping scheme. In some embodiments, the plurality of states of the state machine circuit identify one or more operational modes associated with the tracker circuit, wherein the one or more operational modes comprises one or more voltage levels respectively associated therewith. In some embodiments, the transitions associated with the predefined mapping scheme comprises forbidden transitions associated with the predefined mapping scheme. In some embodiments, a transition between the one or more operational modes of the tracker circuit is defined, at least partly, based on the forbidden transitions associated with the predefined mapping scheme.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, envelope tracking systems provide significant advantages in terms of minimizing power consumption in power amplifiers. Envelope tracking systems typically comprise a power management integrated circuit (PMIC) that provides a variable voltage level to a PA and a control circuit that selects the voltage level of the PMIC based on the transmitted signal (e.g., the power of the signal to be transmitted). In some embodiments, the control circuit may further pre-distort the transmitted signal, in order to compensate for the non-linearity of the PA. In the embodiments described herein, the PMIC is referred to as a tracker circuit. In some embodiments, the envelope tracking systems employ digital envelope tracking, where an output voltage of the tracker circuit is a voltage level out of a set of predetermined voltage levels. In some embodiments, the voltage level to be provided to the PA is signaled to the tracker circuit based on a digital signal, for example, a 2-bit signal. However, in typical implementations, only 4 voltage levels are identified using 2 bits and is therefore the number of voltage levels that can be signaled using the 2-bit signal is limited. For example, in typical implementations, a 2-bit digital signal can signal only 4 voltage levels typically identified by the bits 00, 01, 10 and 11.

Further, as indicated above, in some embodiments, the envelope tracking systems may be configured to operate in one or more operational modes, in order to enable for the efficient operation of the power amplifier. In the embodiments described herein, operational modes correspond to a particular mode of operation of the tracker circuit. In some embodiments, the one or more operational modes comprises an active operational mode comprising operational modes in which the tracker circuit is actively providing a supply voltage to the PA and an inactive operational mode (e.g., an OFF mode) in which the tracker circuit turns off its power consuming circuits and does not put power consumption burden on transceiver activities such as "receive". Further, other operating modes different from above are also contemplated to be within the scope of this disclosure, for example, a transition mode that facilitates a transition from one operating mode to another. Some examples of active operational modes include an envelope tracking (ET) mode and an average power tracking (APT) mode. In some embodiments, each of these active operational modes may comprise one or more voltage levels associated therewith. In typical implementations of the envelope tracking systems, a transition between the different active operational modes is achieved through MIPI radio frequency front end (RFFE) writings. In some embodiments, the tracker circuit comprises a MIPI RFFE interface associated therewith. However, the transition times between the different operational modes using MIPI RFFE writings is typically greater than the preferable transition times for some applications, for example, Wi-Fi. In Wi-Fi, transitions between the different operational modes should typically happen within few microseconds, since the Wi-Fi device may need to decode a previous packet first to know the transmit power of the next packet, and the modes such as ET and APT are related to transmit power.

In order to overcome the above disadvantages, an apparatus and a method for a tracker circuit associated with an envelope tracking system is proposed in this disclosure. In particular, an envelope tracking system that utilizes a digital selection signal (e.g., a 2-bit digital signal) from a digital communication interface (e.g., a 2-bit digital interface) to signal the transitions between the different operational modes and the voltages associated with a tracker circuit is proposed herein. In some embodiments, the proposed envelope tracking system is realized based on implementing a state machine circuit within a tracker circuit associated with the envelope tracking system. In some embodiments, the state machine circuit within the tracker circuit identifies the one or more operational modes associated with the tracker circuit, or one or more voltage levels respectively associated with the one or more operational modes, or both.

FIG. 1 illustrates an exemplary simplified block diagram of a power amplifier (PA) system 100, according to one embodiment of the disclosure. In some embodiments, the PA system 100 could be part of a transmit circuitry associated with a wireless communication system. The PA system 100 comprises a PA circuit 102, a control circuit 106, a digital control line (DCL) circuit 108 and a tracker circuit 104. In some embodiments, the control circuit 106 comprises a level selector circuit 106a. In some embodiments, the control circuit 106 may further comprise one or more additional circuits, for example, a digital predistortion circuit; however, it is not shown here for the ease of reference. In some embodiments, the PA system 100 can comprise more or less than the above components, however, is not shown here for the ease of reference. In some embodiments, the level selector circuit 106a and the tracker circuit 104 facilitates to establish envelope tracking in the PA system 100. In some embodiments, the level selector circuit 106a and the tracker circuit 104 together may be referred to as an envelope tracking system associated with the PA system 100. In some embodiments, the tracker circuit 104 and the control circuit 106 are implemented as two separate components or on two separate chips. However, in other embodiments, the tracker circuit 104 and the control circuit 106 are integrated on a single chip.

In some embodiments, the PA circuit 102 is configured to receive a PA input signal 114 from a PA input signal path 107 and generate a PA output signal 116 based thereon. In some embodiments, the PA output signal 116 is an amplified version of the PA input signal 114. In some embodiments, the PA circuit 102 is configured to receive the PA input signal 114 from the control circuit 106. In some embodiments, the control circuit 106 is configured to receive an input signal 110 (e.g., a baseband signal) and process the input signal 110, in order to generate the PA input signal 114. In such embodiments, the PA input signal 114 is a processed version of the input signal 110. In some embodiments, the control circuit 106 may comprise a digital predistortion (DPD) circuit (not shown) along the PA input signal path configured to process the input signal 110 (e.g., apply a digital predistortion) and generate the PA input signal 114. In some embodiments, the control circuit 106 may further comprise a radio frequency (RF) up conversion circuit (not shown) coupled to the DPD circuit along the PA input signal path 107 and configured to convert an output of the DPD circuit to RF domain, thereby generating the PA input signal 114 in RF domain. In some embodiments, the PA circuit 102 is further configured to receive a supply signal 112 (e.g., a supply voltage) from the tracker circuit 104. In some embodiments, the tracker circuit 104 is configured to provide a variable supply voltage (via the supply signal 112) to the PA circuit 102, in order to enable the PA circuit 102 to operate close to its peak efficiency.

In some embodiments, in particular, in digital envelope tracking systems, the tracker circuit 104 may be configured to provide the variable supply voltage based on providing a supply voltage level out of a set of predetermined voltage levels within the tracker circuit 104. In some embodiments, the tracker circuit 104 is configured to operate in different operational modes, in order to enable the PA circuit 102 to operate at its peak efficiency. For example, in one instance, the tracker circuit 104 may be configured to operate in an envelope tracking (ET) mode in which the tracker circuit 104 follows an instantaneous envelope of the input signal 110 or the PA output signal 116 (i.e., the signal to be transmitted) in order to provide the variable supply voltage (i.e., the supply signal 112) to the PA circuit 102. In another instance, the tracker circuit 104 may be configured to operate in an average power tracking (APT) mode in which the tracker circuit 104 adjusts the supply voltage (i.e., the supply signal 112) based on an average output power of the PA circuit 102 within a time interval (e.g., a transmission slot or transmission packet). In yet another instance, the tracker circuit 104 may be configured to operate in an OFF mode or a standby mode or an idle mode in which the tracker circuit 104 turns off its power consuming circuits and does not provide the supply voltage to the PA circuit 102 (e.g., during receive operation of a transceiver).

Further, in other embodiments, the tracker circuit 104 may be configured to operate in other operational modes different than above, for example, non-tracking modes. In some embodiments, the operational modes may comprise one or more voltage levels respectively associated therewith. In general, the tracker circuit 104 may be configured to operate in active operational modes and inactive operational modes. In some embodiments, the active operational modes comprise operational modes in which the tracker circuit 104 is actively providing supply voltage to the PA circuit 102, for example, the ET mode and the APT mode. In some embodiments, the inactive operational modes comprise operational modes in which the tracker circuit 104 is not actively providing the supply voltage to the PA circuit 102 or operational modes in which power consuming circuits associated with the tracker circuit 104 is turned off, for example, the OFF mode or the standby mode or the idle mode. In some embodiments, the tracker circuit 104 behaves differently during different operational modes, in order to supply the variable supply voltage to the PA circuit 102. For example, in the APT mode, the predefined state machine circuit outputs a voltage based on applying a large capacitor for stabilizing the voltage and in the ET mode, the predefined state machine circuit outputs a voltage based on applying a small capacitor for agility.

In order to enable digital envelope tracking, in some embodiments, the various operational modes and the voltages associated therewith may be implemented as a predefined state machine comprising a plurality of states. Therefore, in such embodiments, the tracker circuit 104 may comprise a predefined state machine circuit (not shown) that implements the plurality of states, the details of which are given in the embodiments below. In some embodiments, the plurality of states of the state machine circuit identify the one or more operational modes associated with the tracker circuit 104. In some embodiments, predefined sets of states of the predefined state machine circuit identify one or more voltage levels associated respectively with a corresponding operational mode. In some embodiments, the predefined state machine circuit can comprise one or more states that identify one or more voltage levels that are different from the one or more voltage levels respectively associated with the one or more operating modes.

In some embodiments, the plurality of states of the state machine circuit are mapped in accordance with state transitions associated with a predefined mapping scheme. In some embodiments, the state transitions associated with the predefined mapping scheme can comprise allowable state transitions and forbidden state transitions. In some embodiments, the predefined mapping scheme comprises Gray coding or Gray mapping. In some embodiments, Gray code comprises a binary numeral system in which two successive values differ in only one bit. However, other mapping different from Gray mapping are also contemplated to be within the scope of this disclosure. In some embodiments, a transition between the different operational modes of the state machine circuit is defined based on predefined state transitions associated with the predefined mapping scheme, further details of which are given in embodiments below. For example, in some embodiments, a transition between the different operational modes of the tracker circuit is defined based on mapping the operational modes to predefined trajectories (or sequences of states) comprising allowable state transitions or the forbidden state transitions or both, associated with the predefined mapping scheme, sometimes referred to herein as a trajectory approach. In other embodiments, a transition between the one or more operational modes of the tracker circuit is defined, at least partly, based on assigning a forbidden transition associated with the predefined mapping scheme to a unique state associated with the different operational modes, sometimes referred to herein as a forbidden trajectory approach.

In some embodiments, the level selector circuit 106a associated with the control circuit 106 is configured to generate a digital selection signal 109, in order to signal the operational modes of the tracker circuit or the voltage levels to be provided by the tracker circuit. In some embodiments, the level selector circuit 106 determines the operational mode to operate the tracker circuit 104 in or the voltage levels to be provided by the tracker circuit 104, based on measurements of one or more parameters (e.g., input power, output power etc.) associated with the PA circuit 102. For example, in one instance, a higher output power of the PA circuit 102 indicates a requirement for a higher supply voltage and therefore, in such instances, the digital selection signal 109 can be modified to signal a higher voltage level (or a state associated therewith) to the tracker circuit 104. In some embodiments, the level selector circuit 106a is configured to receive the input signal 110 or the PA input signal 114, in order to perform the above measurements.

In some embodiments, the level selector circuit 106a is further configured to provide the digital selection signal 109 to the DCL circuit 108, in order to convey the digital selection signal 109 to the tracker circuit 104. In some embodiments, the digital selection signal 109 is indicative of the states associated with the predetermined state machine circuit within the tracker circuit 104. In some embodiments, the digital selection signal 109 can be indicative of a single state or a sequence of states associated with the predetermined state machine circuit, in order to signal a voltage level associated with the tracker circuit 104. In some embodiments, it is assumed that the level selector circuit 106a is aware of the predefined state machine circuit within the tracker circuit 104, thereby enabling the level selector circuit 106a to signal the various operational modes and voltage levels associated with the tracker circuit 104. In some embodiments, the level selector circuit 106a is configured to generate the digital selection signal 109 based on an information of a former state of the tracker circuit 104 and the state transitions associated with the predefined state machine circuit. In some embodiments, the digital selection signal 109 enables the tracker circuit 104 to transition between the various operational modes and their corresponding voltages, in order to facilitate the tracker circuit 104 to provide the variable supply voltage to the PA circuit 102.

In some embodiments, the DCL circuit 108 comprises a digital communication/control interface, for example, general purpose input/output (GPIO) pins, coupled between the level selector circuit 106a and the tracker circuit 104 and configured to provide the digital selection signal 109 to the tracker circuit. In some embodiments, the DCL circuit 108 comprises a 2-bit digital interface configured to convey 2-bit digital signals. In the embodiments described in this disclosure, the DCL circuit 108 is implemented as a 2-bit interface and the digital selection signal 109 is a 2-bit digital signal. Therefore, in the embodiments disclosed herein, the predefined state machine circuit within the tracker circuit 104 is implemented based on 2-bit logic. However, in other embodiments, this idea can be extended to higher order digital logic. Therefore, in other embodiments, higher order implementations of the DCL circuit 108 and the predefined state machine circuit, for example, 3-bit logic, 4-bit logic etc., are also contemplated to be within the scope of this disclosure.

Figure 2:
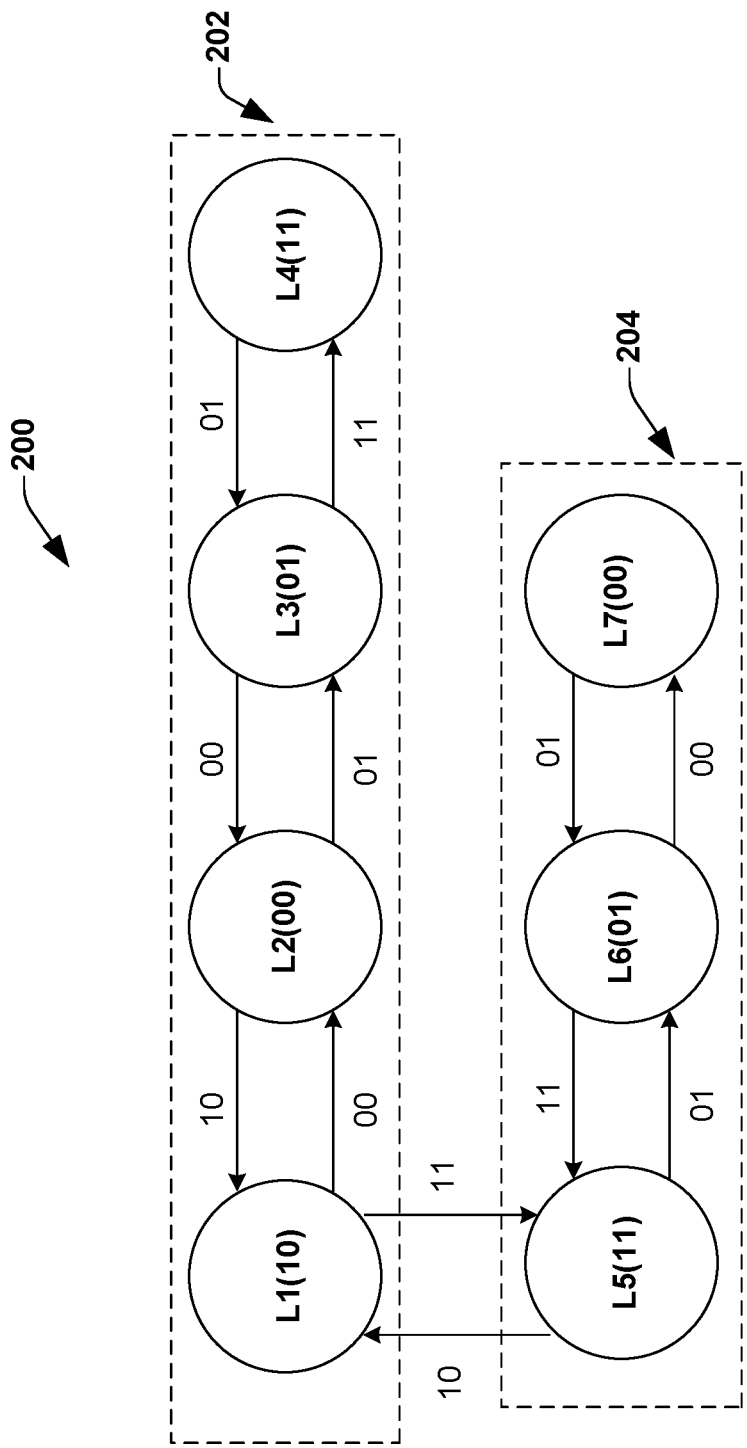
FIG. 2 illustrates an example implementation of a 2-bit state machine circuit, according to one embodiment of the disclosure.

FIG. 2 illustrates an example implementation of a 2-bit state machine circuit 200, according to one embodiment of the disclosure. In some embodiments, the state machine circuit 200 can be implemented within the tracker circuit 104 in FIG. 1 and is explained herein with reference to FIG. 1 above. In this embodiment, the state machine circuit is implemented as a 2-bit state machine circuit. However, the idea can be extended to higher order logic in other embodiments. The state machine circuit 200 comprises 7 states L1, L2 . . . to L7. However, in other embodiments, the state machine circuit 200 can comprise more or less than the above states. In this embodiment, the states L1, L2 . . . to L7 of state machine circuit 200 are Gray mapped or Gray coded. In some embodiments, states that are Gray mapped refers to states that are mapped in accordance with allowable transitions associated with Gray coding. Therefore, in this embodiment, there can be only 2 possible transitions from each state. For example, from state 00, the possible state transitions include states 01 and 10. In other embodiments, other mapping schemes different from Gray mapping may also be utilized. Further, in other embodiments, the state machine circuit 200 may be mapped using forbidden transitions associated with Gray mapping, an example implementation of which is given in FIG. 3 below. In this embodiment, the states L1, L2, L3 and L4 corresponds to voltage levels associated with a first operating mode 202 of the state machine circuit 200 and the states L5, L6 and L7 corresponds to voltage levels associated with a second, different operating mode 204 of the state machine circuit 200. However, in other embodiments, the state machine circuit 200 can comprise more than two operating modes. Further, in other embodiments, the various operating modes can have more or less voltage levels than above.

In some embodiments, both the first operating mode 202 and the second operating mode 204 of the state machine circuit 200 comprises active operating modes. For example, in one embodiment, the first operating mode comprises an envelope tracking (ET) mode and the second operating mode comprises an average power tracking (APT) mode, the details of which are explained above with respect to FIG. 1. However, in other embodiments, the state machine circuit 200 can be implemented differently and can comprise other additional modes, for example, an inactive operational mode. In this embodiment, the transition between the first operational mode and the second operational mode is defined based on mapping the first and the second operational modes to predefined trajectories (or sequences) associated with the state machine circuit 200, in accordance with the trajectory approach indicated above with respect to FIG. 1 above. In this embodiment, the predefined trajectories comprise only allowable transitions associated with Gray coding.

For example, in this example embodiment, the sequence 10 correspond to voltage L1 of the first operating mode, the sequence 10-00 correspond to voltage L2 of the first operating mode, the sequence 10-00-01 correspond to voltage L3 of the first operating mode and the sequence 10-00-01-11 correspond to voltage L4 of the first operating mode. Similarly, the sequence 10-11 correspond to voltage L5 of the second operating mode, the sequence 10-11-01 correspond to voltage L6 of the second operating mode and the sequence 10-11-01-00 correspond to voltage L7 of the second operating mode. In some embodiments, mapping the first and the second operational modes to predefined trajectories (or sequences) enables to signal a transition between the various operational modes based on an information of the previous states of the tracker circuit (or the state machine circuit 200). In some embodiments, mapping the first and the second operational modes to predefined trajectories (or sequences) enables to utilize a same bit value (e.g., 01) to identify multiple voltage levels associated with different operational modes, for example, L3 and L6 in this embodiment. In some embodiments, a transition between the first and the second operational modes is dictated by a digital signal (e.g., the digital selection signal 109 in FIG. 1) indicative of the states of the state machine circuit 200. In some embodiments, the digital signal comprises bit values corresponding to the states associated with the above sequences. In other embodiments, the first and the second operational modes can be mapped to predefined trajectories (or sequences) differently than above.

Figure 3:
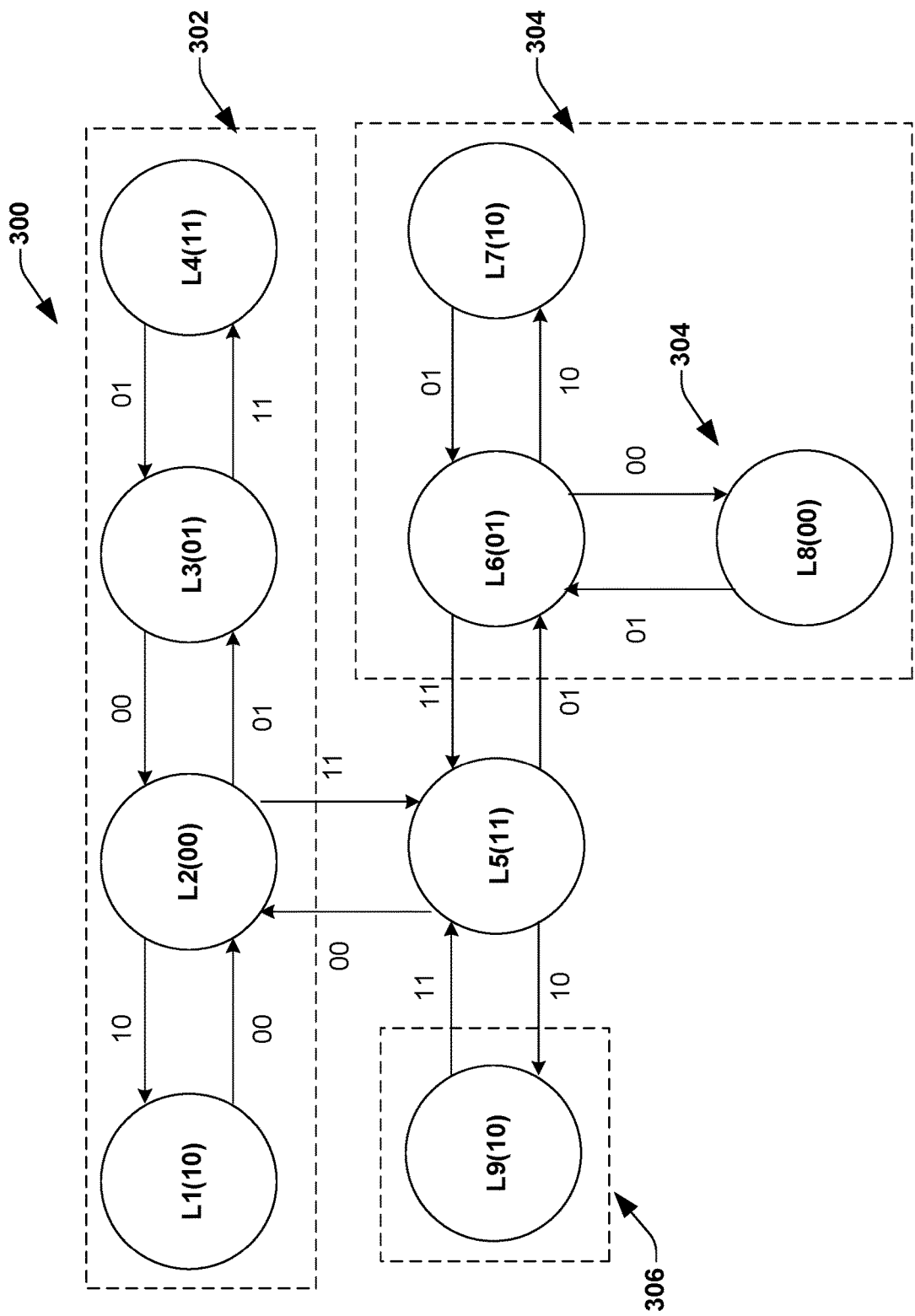
FIG. 3 illustrates an example implementation of a 2-bit state machine circuit, according to another embodiment of the disclosure.

FIG. 3 illustrates an example implementation of a 2-bit state machine circuit 300, according to one embodiment of the disclosure. In some embodiments, the state machine circuit 300 can be implemented within the tracker circuit 104 in FIG. 1 and is explained herein with reference to FIG. 1 above. In this embodiment, the state machine circuit is implemented as a 2-bit state machine circuit. However, the idea can be extended to higher order logic in other embodiments. The state machine circuit 300 comprises 9 states L1, L2 . . . to L9. However, in other embodiments, the state machine circuit 300 can comprise more or less than the above states. In this embodiment, the states L1, L2 . . . to L9 of state machine circuit 300 are mapped by utilizing allowable transitions and forbidden transitions associated with Gray mapping. Therefore, in this embodiment, there can be 3 possible transitions from each state. For example, from state 00, the possible state transitions include states 01, 10 and 11. In other embodiments, other mapping schemes different from Gray mapping may also be utilized. In this embodiment, a transition between various operational modes of the tracker circuit are defined based on mapping the different operational modes to predefined trajectories (or sequences) associated with the state machine circuit 300, in accordance with the trajectory approach indicated above with respect to FIG. 1 above. In this embodiment, the predefined trajectories can comprise allowable transitions or forbidden transitions or both, associated with Gray coding.

In some embodiments, utilizing the forbidden transitions in the state machine circuit 300 enables to increase the number of operating modes and voltage levels identified by the state machine circuit 300. In this embodiment, the states L1, L2, L3 and L4 corresponds to voltage levels associated with a first operating mode 302 of the state machine circuit 300, the state L5 corresponds to a transition state, the states L6, L7 and L8 corresponds to voltage levels associated with a second, different operating mode 304 of the state machine circuit 300, and the state L9 corresponds to a third, different, state 306 of the state machine circuit 300. However, in other embodiments, the state machine circuit 200 can be implemented differently, for example, the various operating modes can have more or less voltage levels than above. In some embodiments, both the first operating mode 302 and the second operating mode 304 of the state machine circuit 300 comprises active operating modes. For example, in one embodiment, the first operating mode 302 comprises an envelope tracking (ET) mode and the second operating mode 304 comprises an average power tracking (APT) mode, the details of which are explained above with respect to FIG. 1. Further, the third operating mode 306 comprises an inactive operational mode, for example, an OFF mode.

In this example embodiment, the sequence 10 correspond to voltage L1 of the first operating mode 302, the sequence 10-00 correspond to voltage L2 of the first operating mode 302, the sequence 10-00-01 correspond to voltage L3 of the first operating mode 302 and the sequence 10-00-01-11 correspond to voltage L4 of the first operating mode 302. Further, the sequence 10-00-11 correspond to a transition operation or a transition state L5. In some embodiments, the transition state indicates a state in which the tracker circuit has moved out of a current operating mode and is transitioning to a different mode. Further, the sequence 10-00-11-01 correspond to voltage L6 of the second operating mode 304, the sequence 10-00-11-01-10 correspond to voltage L7 of the second operating mode 304 and the sequence 10-00-11-01-00 correspond to voltage L8 of the second operating mode 304. In addition, the sequence 10-00-11-10 correspond to voltage L9 of the third operating mode 306. However, in other embodiments, the state machine circuit 300 can be defined differently than above, for example, based on utilizing forbidden transitions within the first operational mode 302. In some embodiments, mapping the first and the second operational modes to predefined trajectories (or sequences) enables to signal a transition between the various operational modes based on an information of the previous states of the tracker circuit (or the state machine circuit 300).

In some embodiments, mapping the first and the second operational modes to predefined trajectories (or sequences) enables to utilize a same bit value for example, 01 to identify multiple voltage levels, L3 and L6, and 10 to identify voltage levels L1, L7 and L9 in this embodiment. In some embodiments, a transition between the various operational modes are dictated by a digital signal (e.g., the digital selection signal 109 in FIG. 1) indicative of the states of the state machine circuit 300. In some embodiments, the digital signal comprises bit values corresponding to the states associated with the above sequences. In other embodiments, the first and the second operational modes can be mapped to predefined trajectories (or sequences) differently than above. In this embodiment, forbidden transitions are utilized to define transitions within a mode as well as for transitions between different modes. However, in some embodiments, forbidden transitions may be assigned to define transition between various modes and the allowed transitions may be assigned to define transitions between different voltage levels within a mode, as given in FIG. 4 below.

Figure 4:
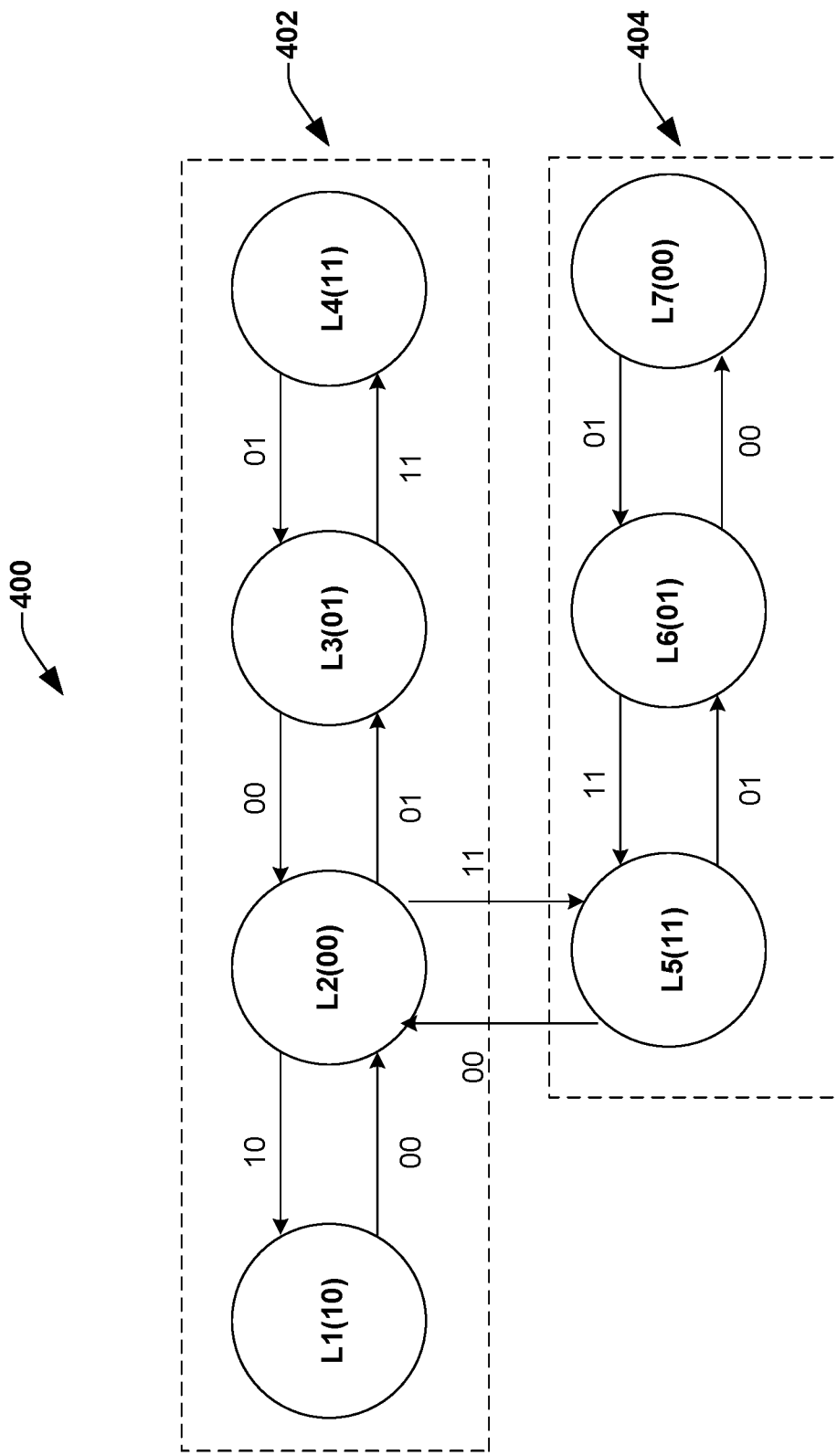
FIG. 4 illustrates an example implementation of a 2-bit state machine circuit, according to yet another embodiment of the disclosure.

FIG. 4 illustrates an example implementation of a 2-bit state machine circuit 400, according to one embodiment of the disclosure. In some embodiments, the state machine circuit 400 can be implemented within the tracker circuit 104 in FIG. 1 and is explained herein with reference to FIG. 1 above. In this embodiment, the state machine circuit 400 is implemented as a 2-bit state machine circuit. However, the idea can be extended to higher order logic in other embodiments. The state machine circuit 400 comprises 7 states L1, L2 . . . to L7. However, in other embodiments, the state machine circuit 300 can comprise more or less than the above states. In this embodiment, the states L1, L2 . . . to L7 of state machine circuit 400 are mapped by utilizing allowable transitions and forbidden transitions associated with Gray mapping. Therefore, in this embodiment, there can be 3 possible transitions from each state. In this embodiment, the states L1, L2, L3 and L4 corresponds to voltage levels associated with a first operating mode 402 of the state machine circuit 400 and the states L5, L6 and L7 corresponds to voltage levels associated with a second, different operating mode 404 of the state machine circuit 400. In some embodiments, utilizing the forbidden transitions in the state machine circuit 400 enables to define a transition from one operational mode to another operational mode associated with the state machine circuit 400.

In some embodiments, both the first operating mode 402 and the second operating mode 404 of the state machine circuit 400 comprises active operating modes. For example, in one embodiment, the first operating mode 402 comprises an envelope tracking (ET) mode and the second operating mode 404 comprises an average power tracking (APT) mode, the details of which are explained above with respect to FIG. 1. However, in other embodiments, the state machine circuit 400 can be implemented differently and can comprise other additional modes, for example, an inactive operational mode. In this embodiment, the transition between the first operational mode and the second operational mode is defined based on assigning a forbidden transition (e.g., L2-L5) associated with the predefined mapping scheme to a unique state (e.g., L2) associated with the one or more operational modes, in accordance with the forbidden trajectory approach indicated above with respect to FIG. 1 above. In this example embodiment, the forbidden transition is assigned to state L2, in order to define the transition from the first operating mode 402 to the second operating mode 404. However, in other embodiments, the forbidden transition can be assigned to other unique states associated with the first operating mode 402, in order to define the transition from the first operating mode 402 to the second operating mode 404. In some embodiments, the forbidden transitions can be assigned to multiple unique states associated with the first operating mode 402, thereby enabling to increase the number of operational modes defined by the state machine circuit 400.

In this example embodiment, the sequence 10 correspond to voltage L1 of the first operating mode 402, the sequence 10-00 correspond to voltage L2 of the first operating mode 402, the sequence 10-00-01 correspond to voltage L3 of the first operating mode 402 and the sequence 10-00-01-11 correspond to voltage L4 of the first operating mode 402. Further, the sequence 10-00-11 (i.e., a forbidden transition) defines a transition from the first operating mode 402 to the second operating mode 404 and also correspond to the voltage L5 of the second operating mode 404. Once the transition from the first operating mode 402 to the second operating mode 404 is defined based on the forbidden transition (L2-L5), the sequence 01 correspond to voltage L6 of the second operating mode 404 and the sequence 01-00 correspond to voltage L7 of the second operating mode 404. In some embodiments, assigning a forbidden transition (e.g., L2-L5) associated with the predefined mapping scheme to a unique state (e.g., L2) associated with the first operational modes enables to utilize a same bit value for example, 01 to identify multiple voltage levels, L3 and L6, and 00 to identify voltage levels L2 and L7 in this embodiment. In some embodiments, a transition between the first and the second operational modes is dictated by a digital signal (e.g., the digital selection signal 109 in FIG. 1) indicative of the states of the state machine circuit 400. In some embodiments, the digital signal comprises bit values corresponding to the states associated with the above sequences.

Figure 5:
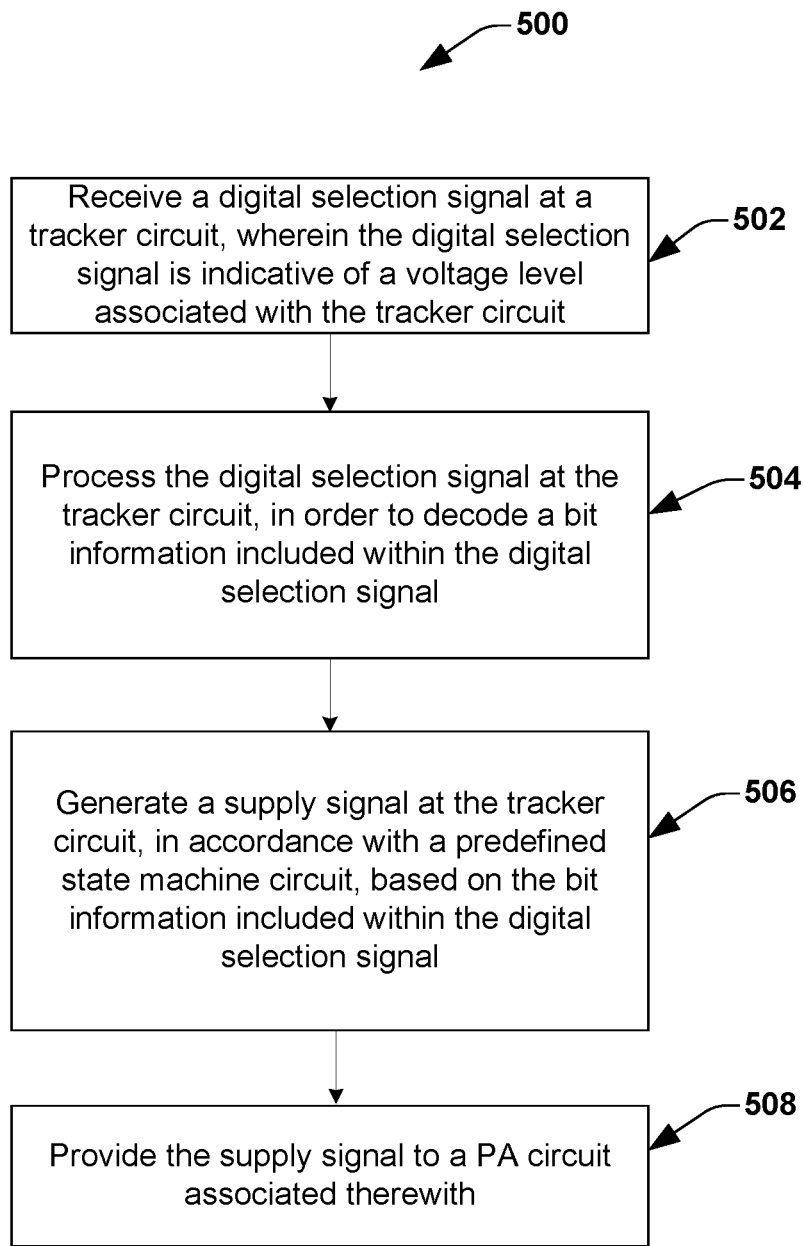
FIG. 5 illustrates a flow diagram of a method for a tracker circuit associated with an envelope tracking system, according to one embodiment of the disclosure.

FIG. 5 illustrates a flow diagram of a method 500 for a tracker circuit associated with an envelope tracking system, according to one embodiment of the disclosure. The method 500 is explained herein with respect to the PA system 100 in FIG. 1. However, in other embodiments, the method 500 can be applied to any tracker circuit in envelope tracking systems associated with a PA system. In some embodiments, the method 500 described herein facilitates to utilize a digital signal, for example, a 2-bit signal in order to signal various operational modes or voltage levels associated with a tracker circuit. At 502, a digital selection signal (e.g., the digital selection signal 109 in FIG. 1) is received at a tracker circuit (e.g., the tracker circuit 104 in FIG. 1). In some embodiments, the digital selection signal is indicative of an output voltage level of the tracker circuit to be provided to a PA circuit (e.g., the PA circuit 102 in FIG. 1) associated therewith. In some embodiments, the digital selection signal is received at the tracker circuit from a level selector circuit (e.g., the level selector circuit 106a in FIG. 1) associated therewith. In some embodiments, the level selector circuit is configured to generate the digital selection signal, based on measuring one or more parameters (e.g., input signal power, output signal power etc.) associated with the PA circuit.

At 504, the digital selection signal is processed at the tracker circuit, in order to decode a bit information associated with the digital selection signal. At 506, a supply signal (e.g., the supply signal 112 in FIG. 1) is generated at the tracker circuit, in accordance with a predefined state machine circuit, based on the bit information associated with the digital selection signal. In some embodiments, the predefined state machine circuit comprises a state machine having a plurality of states mapped in accordance with transitions associated with a predefined mapping scheme. In some embodiments, the predefined mapping scheme comprises Gray mapping/coding. In some embodiments, the plurality of states of the state machine circuit identify one or more operational modes associated with the tracker circuit or one or more voltage levels respectively associated with the one or more operational modes or both. In some embodiments, the plurality of states of the state machine circuit may also identify one or more voltage levels not associated with the one or more operational modes indicated above.

In some embodiments, the one or more operational modes associated with the tracker circuit comprises active operational modes and inactive operational modes, as explained above with respect to FIG. 1. In some embodiments, the active operational modes comprise an envelope tracking (ET) mode and an average power tracking (APT) mode. In some embodiments, the inactive operational modes comprise an OFF mode or a standby mode or an idle mode. However, other operational modes different from above are also contemplated to be within the scope of this disclosure. In some embodiments, a transition between the one or more operational modes of the tracker circuit is dictated by the decoding of the digital selection signal. Further, the transition between the one or more voltage levels associated with the one or more operational modes is also dictated by the decoding of the digital selection signal. At 508, the supply signal generated at the tracker circuit is provided to the PA circuit.

While the methods are illustrated, and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 6:
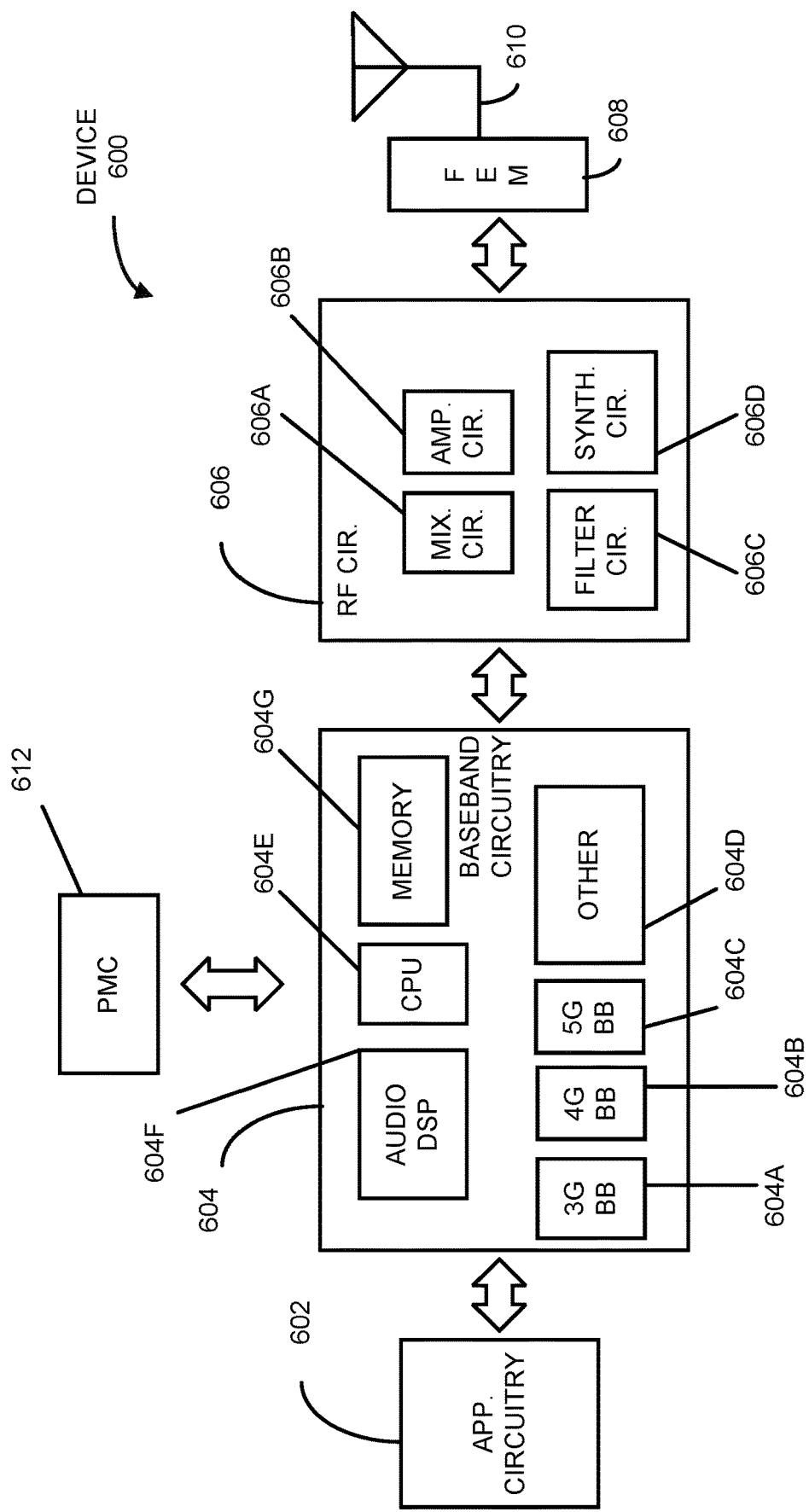
FIG. 6 illustrates example components of a device, in accordance with some embodiments.

FIG. 6 illustrates example components of a device 600 in accordance with some embodiments. In some embodiments, the device 600 may include application circuitry 602, baseband circuitry 604, Radio Frequency (RF) circuitry 606, front-end module (FEM) circuitry 608, one or more antennas 610, and power management circuitry (PMC) 612 coupled together at least as shown. The components of the illustrated device 600 may be included in a UE or a RAN node. In some embodiments, the PA system 100 could be implemented as a part of the device 600. In some embodiments, the device 600 may include less elements (e.g., a RAN node may not utilize application circuitry 602, and instead include a processor/controller to process IP data received from an EPC). In some embodiments, the device 600 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 602 may include one or more application processors. For example, the application circuitry 602 may include circuitry such as, but not limited to, one or more single core or multi-core processor. The processor(s) may include combination of general-purpose processors and dedicated processors (e.g., graphics processors, application processors etc.). The processors may be coupled with or may include memory/storage and may be configured to execute instructions stored in the memory/storage to enable various applications or operating systems to run on the device 600. In some embodiments, processors of application circuitry 602 may process IP data packets received from an EPC.

The baseband circuitry 604 may include circuitry such as, but not limited to, one core processors. The baseband circuitry-core or multi- or more single 604 may include one or more baseband processors or control logic to process baseband signals received from a receive signal path of the RF circuitry 606 and to generate baseband signals for a transmit signal path of the RF circuitry 606. Baseband processing circuity 604 may interface with the application circuitry 602 for generation and processing of the baseband signals and for controlling operations of the RF circuitry 606. For example, in some embodiments, the baseband circuitry 604 may include a third generation (3G) baseband processor 604A, a fourth generation (4G) baseband processor 604B, a fifth generation (5G) baseband processor 604C, or other baseband processor(s) 604D for other existing generations, generations in development or to be developed in the future (e.g., second generation (2G), si8h generation (6G), etc.). The baseband circuitry 604 (e.g., one or more of baseband processors 604A-D) may handle various radio control functions that enable a the RF communication with one or more radio networks vi circuitry 606. In other embodiments, some or all of the functionality of baseband processors 604A-D may be included in modules stored in the memory 604G and executed via a Central Processing Unit (CPU) 604E. The radio control functions may de, but are not limited to, signal modulation/demodulation, encoding/decoding radio inclu frequency shifting, etc. In some embodiments, modulation/demodulation circuitry of the baseband circuitry 604 may include Fast-Fourier Transform (FFT), precoding, or constellation mapping/demapping functionality. In some embodiments, encoding/decoding circuitry of the baseband circuitry 604 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 604 may include one or more audio digital signal processor(s) (DSP) 604F. The audio DSP(s) 604F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 604 and the application circuitry 602 may be implemented (gether such as, for example, on a system on a chip (SOCto.

In some embodiments, the baseband circuitry 604 may provide for communication compatible with one or more radio technologies. For example, in some embodiments, the baseband circuitry 604 may support communication with an evolved universal terrestrial radio access network (EU-TRAN) or other wireless metropolitan area networks (WMAN), a wireless local area network (WLAN), a wireless personal area diments in network (WPAN). Embo which the baseband circuitry 604 is configured to support radio communications of more than one wireless protocol may be referred to as multi-mode baseband circuitry.

RF circuitry 606 may enable communication with wireless networks using lated moduelectromagnetic radiation through a non-solid medium. In various embodiments, the RF circuitry 606 may include switches, filters, amplifiers, etc. to facilitate the communication with the wireless network. RF circuitry 606 may include a receive signal path which may include circuitry to down-convert RF signals received from the FEM circuitry 608 and provide baseband signals to the baseband circuitry 604. RF circuitry 606 may also include a transmit signal path which may include circuitry to up-convert baseband signals provided by the baseband circuitry 604 and provide RF output signals to the FEM circuitry 608 for transmission.

In some embodiments, the receive signal path of the RF circuitry 606 may include mixer circuitry 606a, amplifier circuitry 606b and filter circuitry 606c. In some embodiments, the transmit signal path of the RF circuitry 606 may include filter circuitry 606c and mixer circuitry 606a. RF circuitry 606 may also include synthesizer circuitry 606d for synthesizing a frequency for use by the mixer circuitry 606a of the receive signal path and the transmit signal path. In some embodiments, the mixer circuitry 606a of the receive signal path may be configured to down-convert RF signals received from the FEM circuitry 608 based on the synthesized frequency provided by synthesizer circuitry 606d. The amplifier circuitry 606b may be configured to amplify the down-converted signals and the filter circuitry 606c may be a low-pass filter (LPF) or band-pass filter (BPF) configured to remove unwanted signals from the down-converted signals to generate output baseband signals. Output baseband signals may be provided to the baseband circuitry 604 for further processing. In some embodiments, the output baseband signals may be zero-frequency baseband signals, although this is not a requirement. In some embodiments, mixer circuitry 606a of the receive signal path may comprise passive mixers, although the scope of the embodiments is not limited in this respect.

In some embodiments, the mixer circuitry 606a of the transmit signal path may be configured to up-convert input baseband signals based on the synthesized frequency provided by the synthesizer circuitry 606d to generate RF output signals for the FEM circuitry 608. The baseband signals may be provided by the baseband circuitry 604 and may be filtered by filter circuitry 606c.

In some embodiments, the mixer circuitry 606a of the receive signal path and the mixer circuitry 606a of the transmit signal path may include two or more mixers and may be arranged for quadrature downconversion and upconversion, respectively. In some embodiments, the mixer circuitry 606a of the receive signal path and the mixer circuitry 606a of the transmit signal path may include two or more mixers and may be arranged for image rejection (e.g., Hartley image rejection). In some embodiments, the mixer circuitry 606a of the receive signal path and the mixer circuitry 606a may be arranged for direct downconversion and direct upconversion, respectively. In some embodiments, the mixer circuitry 606a of the receive signal path and the mixer circuitry 606a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 606 may include analog-to-digital converter (ADC) and digital-to-analog converter (DAC) circuitry and the baseband circuitry 604 may include a digital baseband interface to communicate with the RF circuitry 606.

In some dual-mode embodiments, a separate radio IC circuitry may be provided for processing signals for each spectrum, although the scope of the embodiments is not limited in this respect.

In some embodiments, the synthesizer circuitry 606d may be a fractional-N synthesizer or a fractional N/N+1 synthesizer, although the scope of the embodiments is not limited in this respect as other types of frequency synthesizers may be suitable. For example, synthesizer circuitry 606d may be a delta-sigma synthesizer, a frequency multiplier, or a synthesizer comprising a phase-locked loop with a frequency divider. The synthesizer circuitry 606d may be configured to synthesize an output frequency for use by the mixer circuitry 606a of the RF circuitry 606 based on a frequency input and a divider control input. In some embodiments, the synthesizer circuitry 606d may be a fractional N/N+1 synthesizer.

In some embodiments, frequency input may be provided by a voltage controlled oscillator (VCO), although that is not a requirement. Divider control input may be provided by either the baseband circuitry 604 or the applications processor 602 depending on the desired output frequency. In some embodiments, a divider control input (e.g., N) may be determined from a look-up table based on a channel indicated by the applications processor 602.

Synthesizer circuitry 606d of the RF circuitry 606 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 606d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 606 may include an IQ/polar converter.

FEM circuitry 608 may include a receive signal path which may include circuitry configured to operate on RF signals received from one or more antennas 610, amplify the received signals and provide the amplified versions of the received signals to the RF circuitry 606 for further processing. FEM circuitry 608 may also include a transmit signal path which may include circuitry configured to amplify signals for transmission provided by the RF circuitry 606 for transmission by one or more of the one or more antennas 610. In various embodiments, the amplification through the transmit or receive signal paths may be done solely in the RF circuitry 606, solely in the FEM 608, or in both the RF circuitry 606 and the FEM 608.

In some embodiments, the FEM circuitry 608 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 606). The transmit signal path of the FEM circuitry 608 may include a power amplifier (PA) to amplify input RF signals (e.g., provided by RF circuitry 606), and one or more filters to generate RF signals for subsequent transmission (e.g., by one or more of the one or more antennas 610).

In some embodiments, the PMC 612 may manage power provided to the baseband circuitry 604. In particular, the PMC 612 may control power-source selection, voltage scaling, battery charging, or DC-to-DC conversion. The PMC 612 may often be included when the device 600 is capable of being powered by a battery, for example, when the device is included in a UE. The PMC 612 may increase the power conversion efficiency while providing desirable implementation size and heat dissipation characteristics.

While FIG. 6 shows the PMC 612 coupled only with the baseband circuitry 604. However, in other embodiments, the PMC 8 12 may be additionally or alternatively coupled with, and perform similar power management operations for, other components such as, but not limited to, application circuitry 602, RF circuitry 606, or FEM 608. In some embodiments, the PMC 612 may control, or otherwise be part of, various power saving mechanisms of the device 600. For example, if the device 600 is in an RRC_Connected state, where it is still connected to the RAN node as it expects to receive traffic shortly, then it may enter a state known as Discontinuous Reception Mode (DRX) after a period of inactivity. During this state, the device 600 may power down for brief intervals of time and thus save power.

If there is no data traffic activity for an extended period of time, then the device 600 may transition off to an RRC_Idle state, where it disconnects from the network and does not perform operations such as channel quality feedback, handover, etc. The device 600 goes into a very low power state and it performs paging where again it periodically wakes up to listen to the network and then powers down again. The device 600 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 602 and processors of the baseband circuitry 604 may be used to execute elements of one or more instances of a protocol stack. For example, processors of the baseband circuitry 604, alone or in combination, may be used execute Layer 3, Layer 2, or Layer 1 functionality, while processors of the application circuitry 604 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a tracker circuit configured to provide a variable supply voltage to a power amplifier (PA) circuit comprising a state machine circuit comprising a plurality of states mapped in accordance with transitions associated with a mapping scheme, wherein the plurality of states of the state machine circuit identify one or more operational modes associated with the tracker circuit, wherein at least one operational mode comprises one or more voltage levels respectively associated therewith; and wherein a transition between the one or more operational modes of the tracker circuit is controlled by digital selection signal received from a digital communication interface associated therewith.

Example 2 is a circuit, including the subject matter of example 1, wherein the one or more operational modes associated with the tracker circuit further comprise at least one inactive operational mode.

Example 3 is a circuit, including the subject matter of examples 1-2, including or omitting elements, wherein the digital communication interface comprises a 2-bit digital interface and the digital selection signal comprises a 2-bit digital signal.

Example 4 is a circuit, including the subject matter of examples 1-3, including or omitting elements, wherein a transition between the one or more operational modes of the tracker circuit is defined based on mapping the one or more operational modes to predefined trajectories comprising allowable state transitions associated with the predefined mapping scheme.

Example 5 is a circuit, including the subject matter of examples 1-4, including or omitting elements, wherein the plurality of states within the predefined state machine circuit is mapped, at least partly, based on forbidden transitions associated with the predefined mapping scheme.

Example 6 is a circuit, including the subject matter of examples 1-5, including or omitting elements, wherein a transition between the one or more operational modes of the tracker circuit is defined based on mapping the one or more operational modes to predefined trajectories comprising, at least partly, the forbidden state transitions associated with the predefined mapping scheme.

Example 7 is a circuit, including the subject matter of examples 1-6, including or omitting elements, wherein a transition between the one or more operational modes of the tracker circuit is defined, at least partly, based on assigning a forbidden transition associated with the predefined mapping scheme to a unique state associated with the one or more operational modes, wherein the forbidden transition is indicative of the transition between the one or more operational modes.

Example 8 is a circuit, including the subject matter of examples 1-7, including or omitting elements, wherein the predefined mapping scheme comprises Gray coding.

Example 9 is a circuit, including the subject matter of examples 1-8, including or omitting elements, wherein the at least two active operational modes of the tracker circuit comprises a first active operational mode comprising an envelope tracking (ET) mode and a second, different, active operational mode comprising an average power tracking (APT) mode.

Example 10 is a circuit, including the subject matter of examples 1-9, including or omitting elements, wherein the active operational modes comprise operational modes other than an OFF mode or a standby mode or an idle mode.

Example 11 is a circuit, including the subject matter of examples 1-10, including or omitting elements, wherein the at least one inactive operational mode of the tracker circuit comprises an OFF mode or a standby mode or an idle mode.

Example 12 is an apparatus for envelope tracking associated with a power amplifier (PA) system comprises a tracker circuit configured to provide a variable supply voltage to the PA circuit, wherein the tracker circuit comprises a state machine circuit comprising a plurality of states mapped in accordance with transitions associated with a mapping scheme, wherein the plurality of states of the state machine circuit identify one or more operational modes associated with the tracker circuit, wherein at least one operational mode comprises one or more voltage levels respectively associated therewith; and wherein a transition between the one or more operational modes of the tracker circuit is controlled by a digital selection signal received from a digital communication interface associated therewith.

Example 13 is an apparatus, including the subject matter of example 12, further comprising a digital control line (DCL) circuit comprising the digital communication interface configured to provide the digital selection signal to the tracker circuit.

Example 14 is an apparatus, including the subject matter of examples 12-13, including or omitting elements, further comprising a level selector circuit configured to generate the digital selection signal, based on a measurement associated with the PA circuit; and provide the digital selection signal to the DCL circuit.

Example 15 is an apparatus, including the subject matter of examples 12-14, including or omitting elements, wherein the digital communication interface comprises a 2-bit digital interface and the digital selection signal comprises a 2-bit digital signal.

Example 16 is an apparatus, including the subject matter of examples 12-15, including or omitting elements, wherein the one or more operational modes associated with the tracker circuit further comprises at least one inactive operational mode.

Example 17 is an apparatus, including the subject matter of examples 12-16, including or omitting elements, wherein the transition between the one or more operational modes of the tracker circuit is defined based on mapping the one or more operational modes to predefined trajectories of the state machine circuit, wherein the predefined trajectories comprises allowable state transitions associated with a predefined mapping scheme.

Example 18 is an apparatus, including the subject matter of examples 12-17, including or omitting elements, wherein the plurality of states within the predefined state machine circuit is mapped, at least partly, based on forbidden transitions associated with a predefined mapping scheme.

Example 19 is an apparatus, including the subject matter of examples 12-18, including or omitting elements, wherein a transition between the one or more operational modes of the tracker circuit is achieved based on mapping the one or more operational modes to predefined trajectories of the state machine circuit, wherein the predefined trajectories comprises allowable state transitions or the forbidden state transitions or both, associated with the predefined mapping scheme.

Example 20 is an apparatus, including the subject matter of examples 12-19, including or omitting elements, wherein a transition between the one or more operational modes of the tracker circuit is defined, at least partly, based on assigning a forbidden transition associated with the predefined mapping scheme to unique states associated with the one or more operational modes, wherein the forbidden transition is indicative of the transition between the one or more operational modes.

Example 21 is an apparatus, including the subject matter of examples 12-20, including or omitting elements, wherein the predefined mapping scheme comprises Gray coding.

Example 22 is an apparatus, including the subject matter of examples 12-21, including or omitting elements, wherein the at least two active operational modes of the tracker circuit comprises a first active operational mode comprising an envelope tracking (ET) mode and a second, different, active operational mode comprising an average power tracking (APT) mode.

Example 23 is an apparatus, including the subject matter of examples 12-22, including or omitting elements, wherein the at least one inactive operational mode of the tracker circuit comprises an OFF mode or a standby mode or an idle mode.

Example 24 is a tracker circuit configured to provide a variable supply voltage to a power amplifier (PA) circuit comprising a state machine circuit comprising a plurality of states mapped in accordance with transitions associated with a mapping scheme, wherein the plurality of states of the state machine circuit identify one or more operational modes associated with the tracker circuit, wherein at least one operational mode comprises one or more voltage levels respectively associated therewith, wherein the transitions associated with the predefined mapping scheme comprises forbidden transitions associated with the mapping scheme; and wherein a transition between the one or more operational modes of the tracker circuit is defined, at least partly, based on the forbidden transitions associated with the mapping scheme.

Example 25 is a circuit, including the subject matter of example 24, wherein a transition between the one or more operational modes of the tracker circuit is defined based on mapping the one or more operational modes to predefined trajectories of the state machine circuit, wherein the predefined trajectories comprises allowable state transitions or the forbidden state transitions or both, associated with the predefined mapping scheme.

Example 26 is a circuit, including the subject matter of examples 24-25, including or omitting elements, wherein a transition between the one or more operational modes of the tracker circuit is defined, at least partly, based on assigning a forbidden transition associated with the predefined mapping scheme to unique states associated with the one or more operational modes, wherein the forbidden transition is indicative of the transition between the one or more operational modes.

Example 27 is a circuit, including the subject matter of examples 24-26, including or omitting elements, wherein a transition between the one or more operational modes of the tracker circuit is dictated by a decoding of a digital selection signal received from a digital communication interface associated therewith.

Example 28 is a circuit, including the subject matter of examples 24-27, including or omitting elements, wherein the digital selection signal comprises a 2-bit digital signal and the digital communication interface comprises a 2-bit digital interface.

Example 29 is a circuit, including the subject matter of examples 24-28, including or omitting elements, wherein the predefined mapping scheme comprises Gray coding.

Example 30 is a circuit, including the subject matter of examples 24-29, including or omitting elements, wherein the one or more operational modes comprises an active operational mode and an inactive operational mode.

Example 31 is a circuit, including the subject matter of examples 24-30, including or omitting elements, wherein the one or more operational modes comprises a first active operational mode and a second, different, active operational mode.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A tracker circuit configured to provide a variable supply voltage to a power amplifier (PA) circuit comprises:
    a state machine circuit comprising a plurality of states mapped in accordance with transitions associated with a mapping scheme, wherein the plurality of states of the state machine circuit identify one or more operational modes associated with the tracker circuit, wherein—at least one operational mode comprises one or more voltage levels associated therewith;
    wherein a transition between the one or more operational modes of the tracker circuit is controlled by a digital selection signal received from a digital communication interface associated therewith; and
    wherein the transition between the one or more operational modes of the tracker circuit is defined based on mapping the one or more operational modes to trajectories comprising allowable state transitions associated with the mapping scheme.

2. The circuit of claim 1, wherein the one or more operational modes associated with the tracker circuit further comprise at least one inactive operational mode.

3. The circuit of claim 2, wherein the at least one inactive operational mode comprises one or more of an off mode, a standby mode and an idle mode.

4. The circuit of claim 1, wherein the one or more operational modes comprise an envelope tracking (ET) mode.

5. The circuit of claim 1, wherein the one or more operational modes comprise an average power tracking (APT) mode.

6. The circuit of claim 1, wherein the one or more operational modes comprise a non-tracking mode.

7. The circuit of claim 1, wherein the plurality of states within the state machine circuit is mapped, at least partly, based on forbidden transitions associated with the mapping scheme.

8. The circuit of claim 7, wherein the transition between the one or more operational modes of the tracker circuit is defined based on mapping the one or more operational modes to trajectories comprising, at least partly, the forbidden state transitions associated with the mapping scheme.

9. The circuit of claim 7, wherein the transition between the one or more operational modes of the tracker circuit is defined, at least partly, based on assigning a forbidden transition associated with the mapping scheme to a unique state associated with the one or more operational modes, wherein the forbidden transition is indicative of the transition between the one or more operational modes.

10. An apparatus for envelope tracking associated with a power amplifier (PA) circuit comprises a tracker circuit configured to:
    provide a variable supply voltage to the PA circuit,
    wherein the tracker circuit comprises a state machine circuit comprising a plurality of states mapped in accordance with transitions associated with a mapping scheme, wherein the plurality of states of the state machine circuit identify one or more operational modes associated with the tracker circuit, wherein the one operational mode comprises one or more voltage levels associated therewith; and
    wherein a transition between the one or more operational modes of the tracker circuit is controlled by a digital selection signal received from a digital communication interface associated therewith; and
    wherein the transition between the one or more operational modes of the tracker circuit is defined based on mapping the one or more operational modes to trajectories of the state machine circuit, wherein the trajectories comprises allowable state transitions associated with a mapping scheme.

11. The apparatus of claim 10, further comprising a digital control line (DCL) circuit comprising the digital communication interface configured to provide the digital selection signal to the tracker circuit.

12. The apparatus of claim 11, further comprising a level selector circuit configured to:
generate the digital selection signal, based on a measurement associated with the PA circuit; and
provide the digital selection signal to the DCL circuit.

13. The apparatus of claim 10, wherein the one or more operational modes associated with the tracker circuit further comprises at least one inactive operational mode.

14. The circuit of claim 13, wherein the at least one inactive operational mode comprises one or more of an off mode, a standby mode and an idle mode.

15. The circuit of claim 10, wherein the one or more operational modes comprise an envelope tracking (ET) mode.

16. The circuit of claim 10, wherein the one or more operational modes comprise an average power tracking (APT) mode.

17. The circuit of claim 10, wherein the one or more operational modes comprise a non-tracking mode.

18. The circuit of claim 10, wherein the plurality of states within the state machine circuit is mapped, at least partly, based on forbidden transitions associated with a mapping scheme.

19. The circuit of claim 18, wherein the transition between the one or more operational modes of the tracker circuit is defined based on mapping the one or more operational modes to trajectories of the state machine circuit, wherein the trajectories comprises allowable state transitions or the forbidden state transitions or both, associated with the mapping scheme.

20. The circuit of claim 18, wherein the transition between the one or more operational modes of the tracker circuit is defined, at least partly, based on assigning a forbidden transition associated with the mapping scheme to a unique states associated with the one or more operational modes, wherein the forbidden transition is indicative of the transition between the one or more operational modes.

* * * * *